(12) United States Patent
Honma

(10) Patent No.: US 12,297,536 B2
(45) Date of Patent: May 13, 2025

(54) SUBSTRATE PROCESSING APPARATUS AND SUBSTRATE PROCESSING METHOD

(71) Applicant: Tokyo Electron Limited, Tokyo (JP)

(72) Inventor: Manabu Honma, Oshu (JP)

(73) Assignee: Tokyo Electron Limited, Tokyo (JP)

( * ) Notice: Subject to any disclaimer, the term of this patent is extended or adjusted under 35 U.S.C. 154(b) by 430 days.

(21) Appl. No.: 17/664,881

(22) Filed: May 25, 2022

(65) Prior Publication Data

US 2022/0389581 A1    Dec. 8, 2022

(30) Foreign Application Priority Data

Jun. 2, 2021 (JP) .................................. 2021-093193

(51) Int. Cl.
| | | |
|---|---|---|
| *C23C 16/455* | (2006.01) | |
| *C23C 16/458* | (2006.01) | |
| *H01L 21/02* | (2006.01) | |
| *H01L 21/687* | (2006.01) | |

(52) U.S. Cl.
CPC .... *C23C 16/45544* (2013.01); *C23C 16/4584* (2013.01); *H01L 21/0228* (2013.01); *H01L 21/68742* (2013.01); *H01L 21/68764* (2013.01); *H01L 21/68771* (2013.01)

(58) Field of Classification Search
CPC .............. C23C 16/45544; C23C 16/46; C23C 16/455551; C23C 16/4586; C23C 16/4584; H01L 21/68742; H01L 21/68771; H01L 21/68764; H01L 21/68792; H01L 21/67103
See application file for complete search history.

(56) References Cited

U.S. PATENT DOCUMENTS

2010/0083986 A1 *  4/2010  Kamikawa ........ H01L 21/68792
                                                    134/26
2017/0287770 A1 * 10/2017  Gangakhedkar ...........................
                                                    H01L 21/68771

FOREIGN PATENT DOCUMENTS

JP         2015-159248 A     9/2015

* cited by examiner

*Primary Examiner* — Joseph A Miller, Jr.
(74) *Attorney, Agent, or Firm* — Armstrong Teasdale LLP

(57) ABSTRACT

A substrate processing apparatus includes: a rotary table provided in a processing container; a rotation mechanism configured to rotate the rotary table; recesses provided on an upper surface of the rotary table along a rotation direction of the rotary table and configured to accommodate substrates, respectively; a processing gas supply provided above the rotary table and configured to supply a processing gas onto the rotary table to process each of the substrates; a heater configured to heat the rotary table; a support configured to support the substrates in upper regions above the recesses so that the heater heats the substrates before being accommodated in the recesses; and an elevating mechanism configured to raise and lower the support relative to the rotary table so that the substrates are collectively moved from the upper regions into the recesses.

2 Claims, 11 Drawing Sheets

SUBSTRATE PROCESSING APPARATUS AND SUBSTRATE PROCESSING METHOD

CROSS-REFERENCE TO RELATED APPLICATION

This application is based upon and claims the benefit of priority from Japanese Patent Application No. 2021-093193, filed on Jun. 2, 2021, the entire contents of which are incorporated herein by reference.

TECHNICAL FIELD

The present disclosure relates to a substrate processing apparatus and a substrate processing method.

BACKGROUND

In a semiconductor device manufacturing process, various processes are performed on a semiconductor wafer (hereinafter referred to as a wafer) which is a substrate. Patent Document 1 discloses, as a substrate processing apparatus, a film forming apparatus that includes a rotary table provided with a plurality of recesses for accommodating wafers in a rotation direction, a nozzle for supplying a raw material gas, and a nozzle for supplying a reaction gas. ALD is performed by the film forming apparatus. The film forming apparatus is provided with three lift pins for sequentially receiving the wafers from a transfer mechanism and sequentially placing the wafers in the recesses.

PRIOR ART DOCUMENT

Patent Document

Patent Document 1: Japanese Laid-Open Patent Publication No. 2015-159248

SUMMARY

According to one embodiment of the present disclosure, there is provided a substrate processing apparatus that includes: a rotary table provided in a processing container; a rotation mechanism configured to rotate the rotary table; a plurality of recesses provided on an upper surface of the rotary table along a rotation direction of the rotary table and configured to accommodate a plurality of substrates, respectively; a processing gas supply provided above the rotary table and configured to supply a processing gas onto the rotary table to process each of the substrates; a heater configured to heat the rotary table; a support configured to support the substrates in upper regions above the recesses so that the heater heats the substrates before being accommodated in the recesses; and an elevating mechanism configured to raise and lower the support relative to the rotary table so that the substrates are collectively moved from the upper regions into the recesses.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
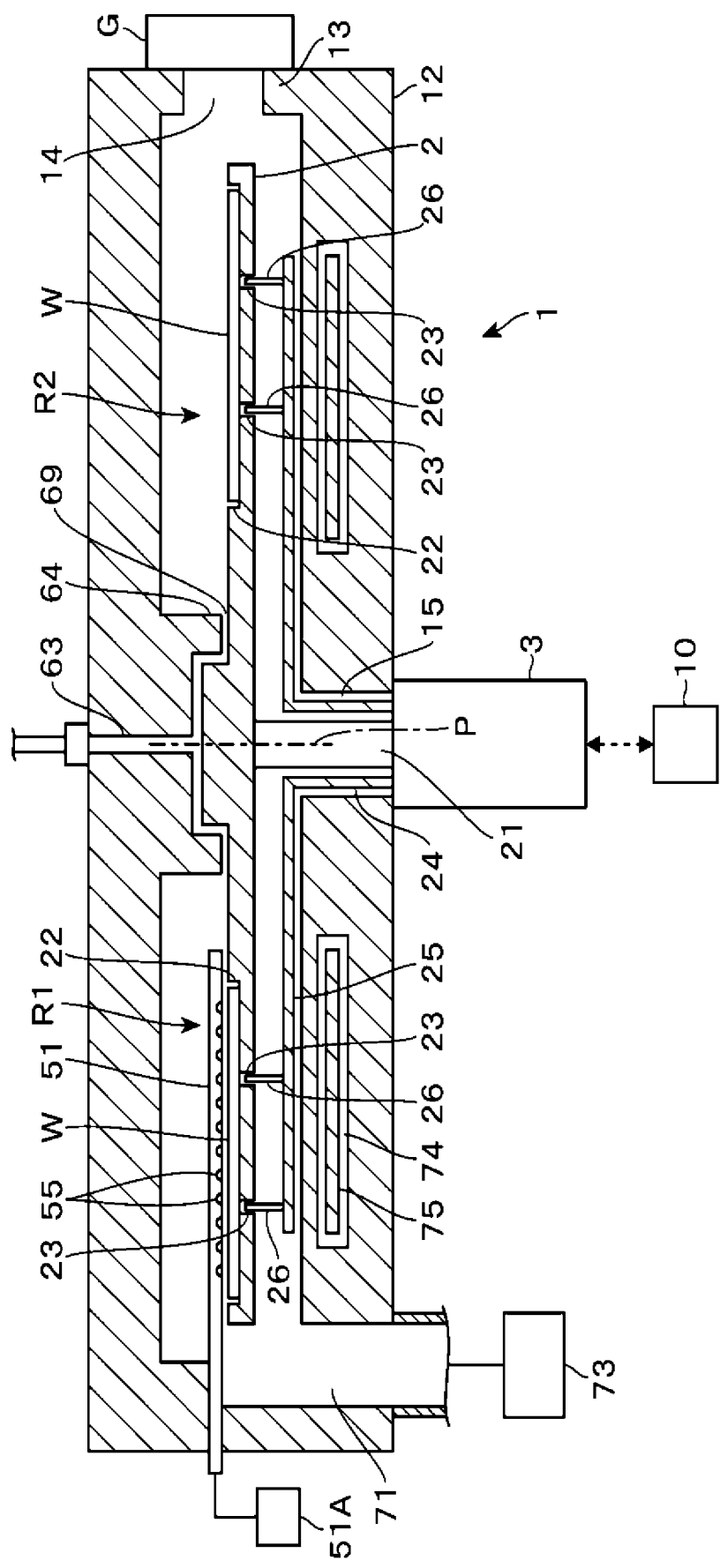
FIG. 1 is a vertical cross-sectional side view of a film forming apparatus as an embodiment of a substrate processing apparatus according to the present disclosure.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

A film forming apparatus 1 as an embodiment of a substrate processing apparatus according to the present disclosure will be described with reference to a vertical cross-sectional side view of FIG. 1 and a horizontal cross-sectional plan view of FIG. 2. The film forming apparatus 1 is configured to form films on six wafers W collectively by ALD (Atomic Layer Deposition). The film forming apparatus 1 includes a flat circular vacuum container (processing container) 11 having a substantially circular shape in a plan view, and a disk-shaped horizontal rotary table 2 provided in the vacuum container 11.

The vacuum container 11 is composed of a top plate that forms a ceiling of a container, and a container main body that forms a bottom 12 and a side wall 13 of the container. An openable/closable wafer transfer port 14 is formed on the side wall 13 and is opened and closed by a gate valve G. A substrate transfer mechanism 19 enters the vacuum container 11 from the outside of the vacuum container 11 through the transfer port 14 and delivers the wafer W to pins 26 described later. The substrate transfer mechanism 19 is provided with a fork-shaped support having a bifurcated tip, and is configured to move forward and backward and move up and down with respect to the vacuum container 11 while supporting the wafer W. Further, an opening 15 is formed in a vertical direction at a center of the bottom 12 of the vacuum container 11. A drive mechanism 3 is connected so as to close the opening 15 from below.

A disk-shaped horizontal rotary table 2 is provided in the vacuum container 11. A center of the rotary table 2 coincides with a center of the vacuum container 11 in a plan view. An upper end of a circular rod-shaped shaft body 21 extending vertically downward is connected to a central portion of a lower surface of the rotary table 2, and a lower end of the shaft body 21 is connected to the drive mechanism 3. The rotary table 2 is supported in the vacuum container 11 via the shaft body 21 by the drive mechanism 3. The drive mechanism 3 rotates the rotary table 2 about a central axis P of the rotary table 2 that constitutes a vertical axis. A configuration of the drive mechanism 3 will be described in detail later.

On an upper surface (front surface) of the rotary table 2, six circular recesses 22 for accommodating the wafers W are formed at equal intervals along a rotation direction (=a circumferential direction of the rotary table 2). The recesses 22 are arranged equidistant from the center of the rotary table 2. By being arranged as described above, the recesses 22 revolve around the central axis P of the rotary table 2 when the rotary table 2 is rotated. Then, by the rotation of the rotary table 2, one of the six recesses 22 can be positioned at a position where the recess faces the transfer port 14 so that the wafer W can be delivered by the substrate transfer mechanism 19. A diameter of the recess 22 is formed to be slightly larger than a diameter of the wafer W so that the wafer W can be accommodated therein.

Figure 3:
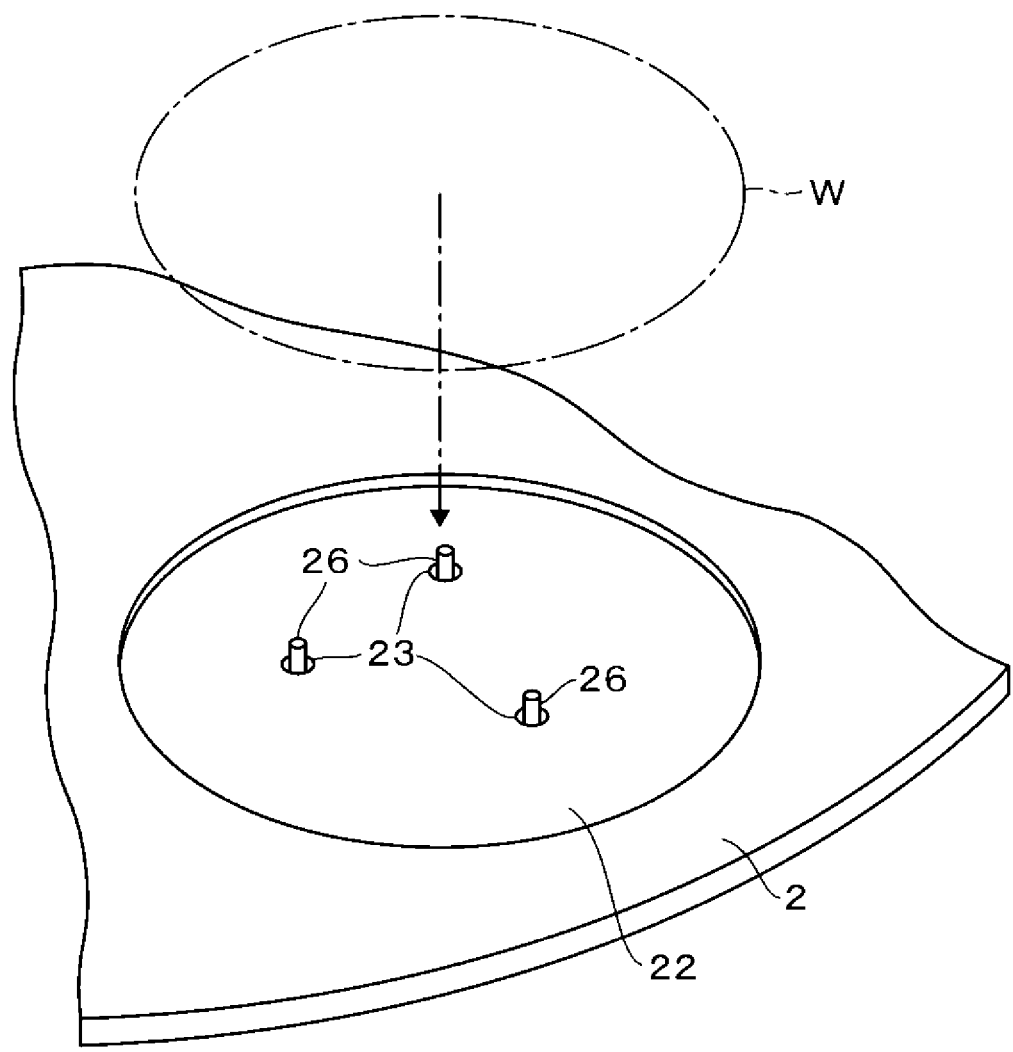
FIG. 3 is a perspective view of an upper surface of a recess.
Figure 4:
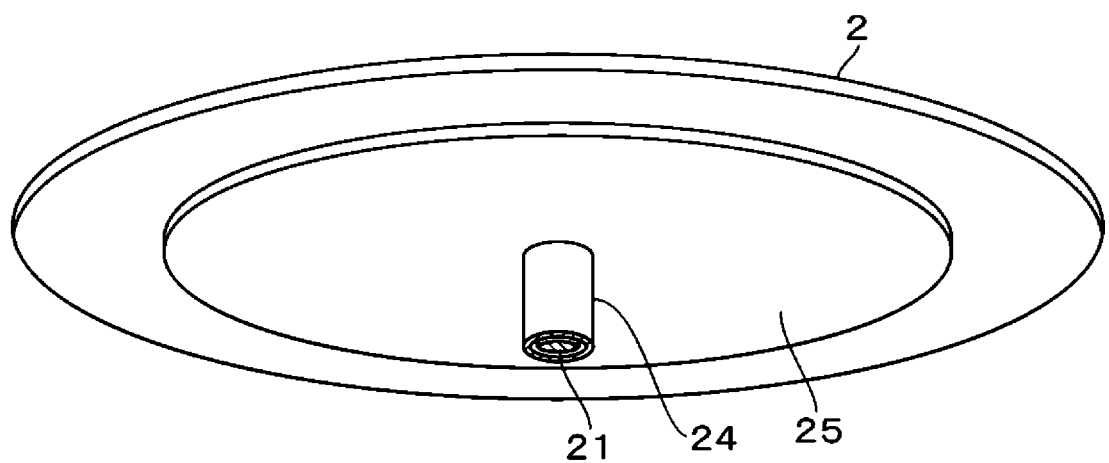
FIG. 4 is a perspective view of a lower surface of a rotary table.

The rotary table 2 will be described with reference to FIGS. 3 and 4, which are an upper surface side perspective view and a lower surface side perspective view, respectively. A plurality of, for example, three, through-holes 23 are opened on a bottom surface of each recess 22. Each through-hole 23 is formed in a thickness direction of the rotary table 2. Below the rotary table 2, a cylindrical body 24 extending in the vertical direction is provided so as to surround a side circumference of the shaft body 21 connected to the rotary table 2 described above. Therefore, the shaft body 21 and the cylindrical body 24 are provided so as to extend in the vertical direction. A cylinder axis of the cylindrical body 24 coincides with the central axis P of the rotary table 2 described above.

A lower end of the cylindrical body 24 is connected to the drive mechanism 3, and the cylindrical body 24 is supported by the drive mechanism 3 so that the cylinder axis thereof coincides with the central axis P of the rotary table 2. Further, an upper end of the cylindrical body 24 extends outward from the cylinder shaft to form a horizontal circular support plate 25. An outer edge of the support plate 25 is located closer to the central axis P than an outer edge of the rotary table 2. On an upper surface of the support plate 25, vertically extending pins 26 are provided at positions overlapping with the through-holes 23 in a plan view, respectively. Therefore, the pins 26 are connected to the cylindrical body 24 via the support plate 25. Three pins 26 are provided for each recess 22. As will be described in detail later, the pins 26 serve to perform a transfer of the wafer W between the substrate transfer mechanism 19 and the recess 22, and also serve to horizontally support the wafer W for heating the wafer W before transferring the wafer W into the recess 22.

The drive mechanism 3 rotates the shaft body 21 and the cylindrical body 24 about the central axis P, thereby rotating both the support plate 25 and the rotary table 2 about the central axis P in a clockwise direction in a plan view. Further, the drive mechanism 3 raises and lowers the shaft body 21 and the rotary table 2 in the vertical direction. Therefore, the rotary table 2 is moved up and down relative to the pins 26. A lower position in an elevating range of the rotary table 2 is a position for the substrate transfer mechanism 19 to deliver the wafer W to the pins 26. When the rotary table 2 is positioned at this lower position, upper ends of the pins 26 protrude from the bottom surface of the recess 22 and are located above the rotary table 2 as shown in FIG. 3. Therefore, at this time, the wafer W supported on the pins 26, which are a support, is located in an upper region above the recess 22. Further, an upper position in the elevating range of the rotary table 2 is a position for placing the wafer W in the recess 22 and performing a process. In order to place the wafer W as described above, when the rotary table 2 is located at the upper position, the upper ends of the pins 26 are located below the bottom surface of the recess 22.

On the rotary table 2, a rod-shaped first processing gas nozzle 51, a rod-shaped separation gas nozzle 52, a rod-shaped second processing gas nozzle 53, and a rod-shaped separation gas nozzle 54, which extend from the outer periphery toward the center of the rotary table 2, are arranged clockwise in the named order. Each of the gas nozzles 51 to 54 has discharge holes 55 facing downward and discharges a gas along the diameter of the rotary table 2. The first processing gas nozzle 51 discharges a raw material gas as a first processing gas which is a raw material of a film, and the second processing gas nozzle 53 discharges a reaction gas as a second processing gas which reacts with the raw material gas. The first processing gas nozzle 51 and the second processing gas nozzle 53 form a processing gas supply. The separation gas nozzles 52 and 54 discharge $N_2$ (nitrogen) gas. Reference numeral 51A in the figure designates a first processing gas source connected to the first processing gas nozzle 51, reference numeral 53A in the figure designates a second processing gas source connected to the second processing gas nozzle 53, and reference numeral 52A in the figure designates a $N_2$ gas source connected to the separation gas nozzles 52 and 54.

The top plate of the vacuum container 11 includes bulge portions 61 and 62 having a fan-like shape in a plan view and protruding toward the rotary table 2. The bulge portions 61 and 62 are formed so as to widen from a side of the center of the rotary table 2 toward a side of the outer peripheral side thereof. The bulge portions 61 and 62 are arranged at intervals in the circumferential direction of the rotary table 2. The separation gas nozzles 52 and 54 are embedded in lower surfaces of the bulge portions 61 and 62, respectively, and are arranged so as to equally divide the bulge portions 61 and 62 in the circumferential direction in a plan view.

Regions below the bulge portions 61 and 62 are separation regions D1 and D2 to which $N_2$ gas is supplied from the separation gas nozzles 52 and 54, respectively. Two regions between the separation regions D1 and D2 in the rotation direction of the rotary table 2 include a first processing region R1 where the first processing gas nozzle 51 is provided and a second processing region R2 where the second processing gas nozzle 53 is provided. The separation regions D1 and D2 serve to separate an atmosphere of the first processing region R1 (first processing gas atmosphere) and an atmosphere of the second processing region R2 (second processing gas atmosphere) in the rotation direction of the rotary table 2 by the $N_2$ gas which is a separation gas.

Further, a vertical flow path 63 facing the central portion of the rotary table 2 is formed on a central portion of the top plate, and $N_2$ gas is supplied from the gas source 52A. Then, the $N_2$ gas flows outward in the radial direction of the rotary table 2 through a gap (referred to as a central flow path 69) between an annular protrusion 64 protruding from a central portion of a lower surface of the top plate in an annular shape and a central portion of the rotary table 2 located at the upper position. The $N_2$ gas is a purge gas that prevents the processing gases from being mixed with each other on the central portion of the rotary table 2. A lower surface of the annular protrusion 64 is formed so as to be continuous with the lower surfaces of the bulge portions 61 and 62 that define the separation regions D1 and D2.

In the bottom 12 of the vacuum container 11, exhaust ports 71 and 72 are opened at positions outward of the rotary table 2 in a plan view. The exhaust port 71 is formed at a position radially spaced apart from the first processing region R1 in the rotary table 2 to selectively exhaust the first processing gas among the first and second processing gases. The exhaust port 72 is formed at a position radially spaced apart from the second processing region R2 in the rotary table 2 to selectively exhaust the second processing gas among the first and second processing gases. The gases are exhausted via an exhaust mechanism 73 connected to each of the exhaust ports 71 and 72.

Further, in the bottom 12 of the vacuum container 11, an annular space 74 extending along the rotation direction of the rotary table 2 is provided at a position overlapping with the rotary table 2 and the support plate 25 in a plan view. A heater 75, which is a heater, is arranged in the annular space 74. The heater 75 heats the wafer W on the rotary table 2 to a desired temperature.

Figure 5:
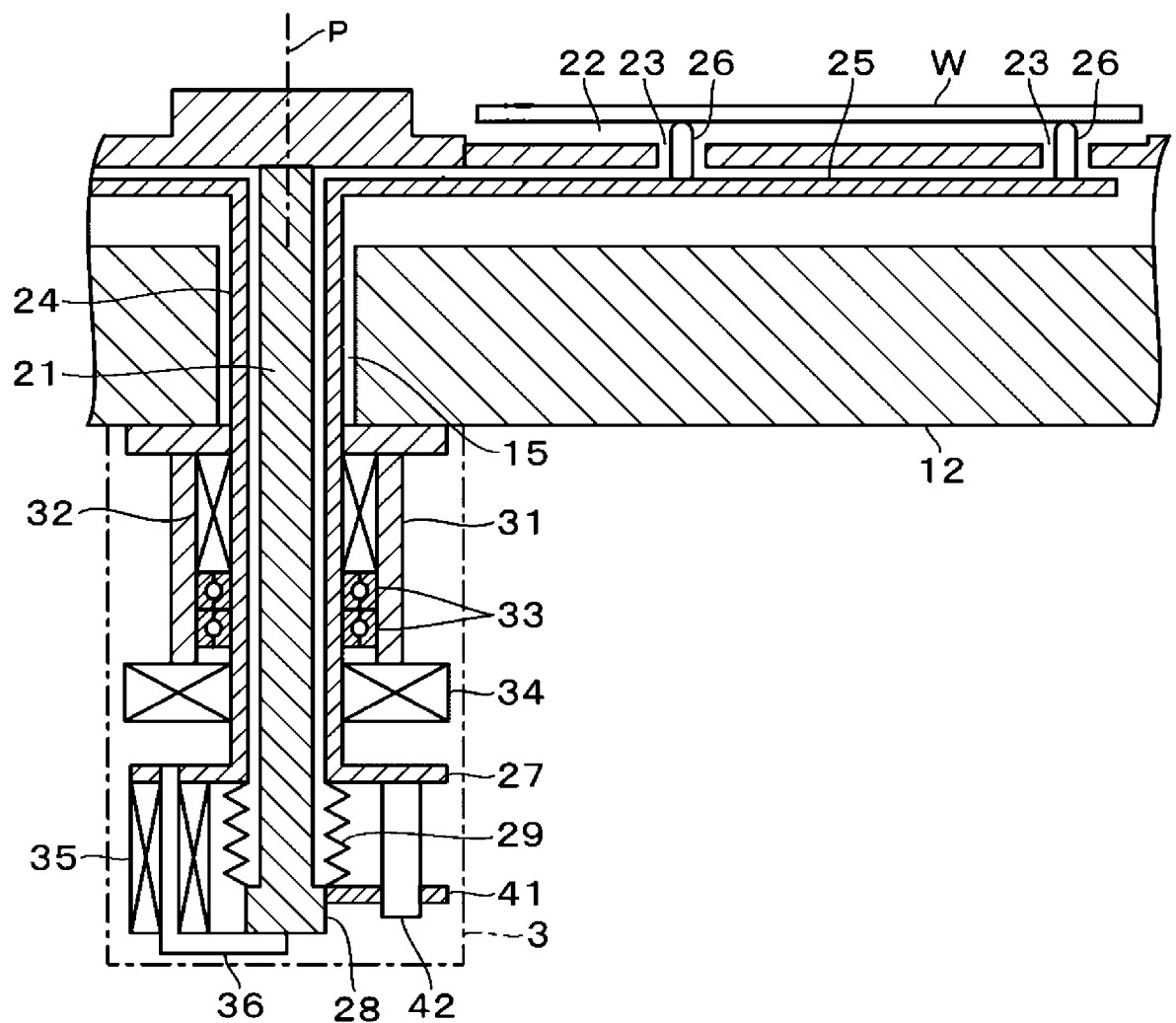
FIG. 5 is a vertical cross-sectional side view showing a rotating/elevating mechanism for a rotary table provided in the film forming apparatus.
Figure 6:
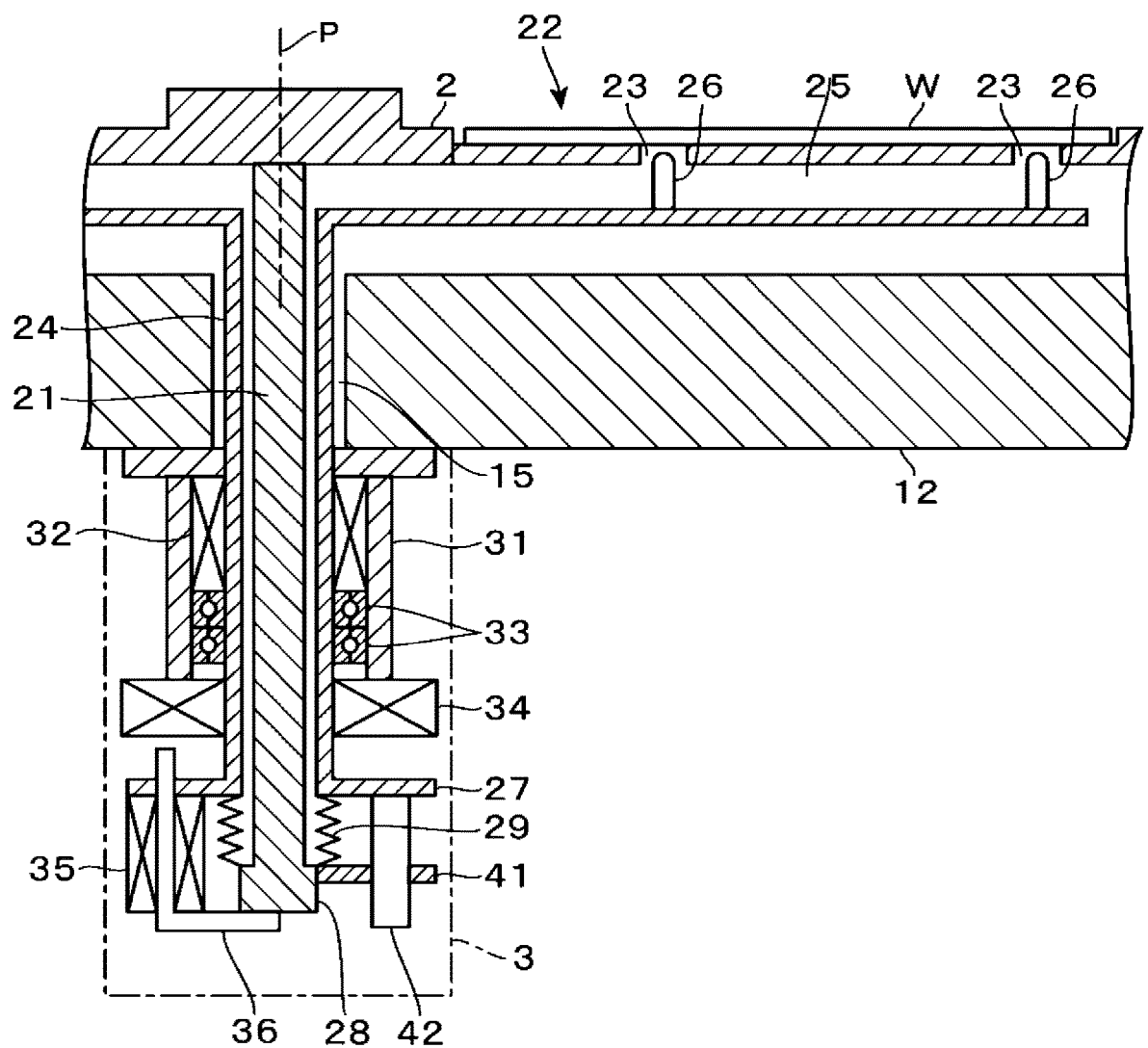
FIG. 6 is a vertical cross-sectional side view showing the rotating/elevating mechanism for the rotary table provided in the film forming apparatus.
Figure 7:
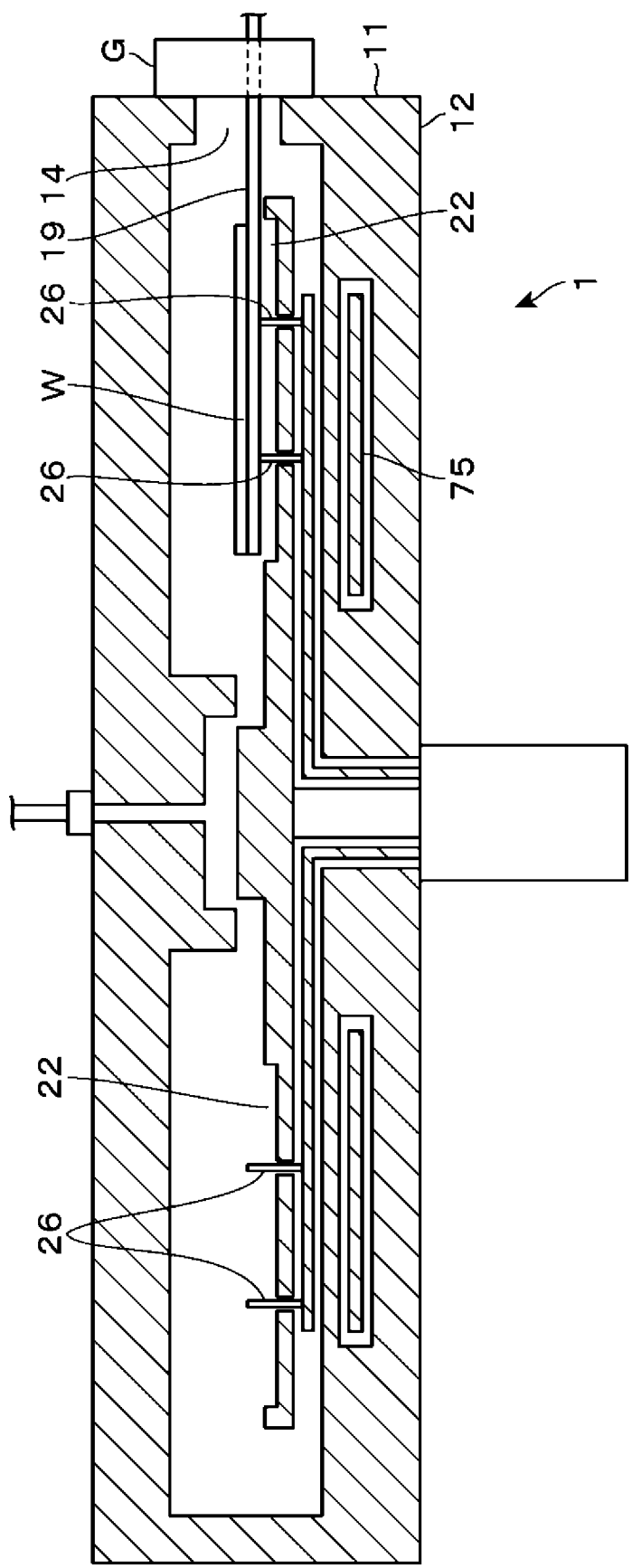
FIG. 7 is a plan view for showing an operation of the film forming apparatus.
Figure 8:
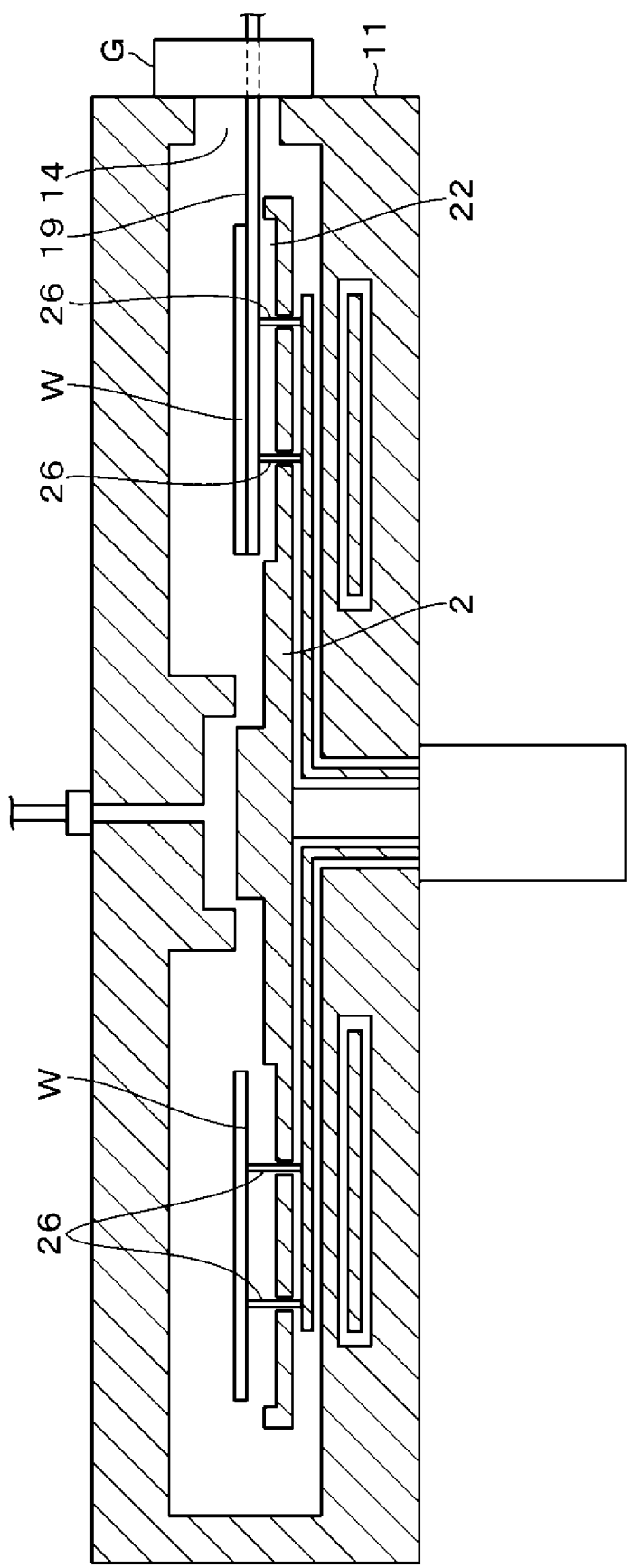
FIG. 8 is a plan view for showing an operation of the film forming apparatus.

Subsequently, configurations of the drive mechanism 3, a lower portion of the shaft body 21 connected to the rotary table 2, and a lower portion of the cylindrical body 24 connected to the support plate 25 will be described with reference to vertical cross-sectional side views of FIGS. 5 and 6. FIGS. 5 and 6 show states when the rotary table 2 is positioned at the lower position and the upper position, respectively. The drive mechanism 3 includes a case body 31, a seal 32, a bearing 33, a rotation mechanism 34, an elevating mechanism 35, and a support 36. The case body 31 is configured in a vertical cylindrical shape to surround the shaft body 21 and the cylindrical body 24. An upper end portion of the case body 31 is widened toward an inner peripheral side and an outer peripheral side of a cylinder formed by the case body 31, and is fixed to an edge portion of the opening 15 of the vacuum container 11. The lower end of the shaft body 21 and the lower end of the cylindrical body 24 extend to positions below a lower end of the case body 31.

The seal 32 and the bearing 33 are provided on an upper portion and a lower portion in the case body 31, respectively, so as to surround the cylindrical body 24. The seal 32 includes, for example, a magnetic fluid which comes into contact with inner peripheral surfaces of the cylindrical body 24 and the case body 31 to ensure a vacuum atmosphere formed inside the vacuum container 11. The rotation mechanism 34 is provided at the lower end of the case body 31. The rotation mechanism 34 includes a motor. An outer peripheral surface of the cylindrical body 24 is connected to the rotation mechanism 34. The cylindrical body 24 is rotated about the central axis P by the rotation mechanism 34 as described above. During a film forming process, the $N_2$ gas as a purge gas is supplied from the gas source 52A to a gap between the opening 15 of the bottom 12 of the vacuum container 11 and the cylindrical body 24 above the seal 32 through a flow path (not shown). The purge gas is exhausted from the exhaust ports 71 and 72 through a space below the rotary table 2.

A lower end portion of the cylindrical body 24 is located below a position where the cylindrical body 24 is connected to the rotation mechanism 34. The lower end portion of the cylindrical body 24 extends outward to form a flange 27.

Further, the lower end portion of the shaft body 21 is located below the flange 27 and is increased in diameter to form a lower head 28. A bellows 29, which is a tubular body that can be expanded and contracted vertically, surrounds the shaft body 21. An upper end of the bellows 29 is connected to an inner edge of a lower surface of the flange 27, and a lower end of the bellows 29 is connected to an upper surface of the lower head 28. As a result, the inside of the vacuum container 11 and the outside of the vacuum container 11 are prevented from communicating with each other through a gap between the shaft body 21 and the cylindrical body 24.

A part of a lateral peripheral surface of the lower head 28 forms a protrusion 41 protruding laterally. A through-hole is formed in the protrusion 41 in the vertical direction. An extension 42 extends vertically downward from a peripheral edge portion of the lower surface of the flange 27, and enters the through-hole of the protrusion 41. The elevating mechanism 35 is provided on the peripheral edge of the lower surface of the flange 27 at a position different from a position where the extension 42 is provided. The support 36 that supports the lower head 28 of the shaft body 21 from below is connected to the elevating mechanism 35.

With the configuration described above, the shaft body 21 is moved up and down with respect to the cylindrical body 24 by the elevating mechanism 35 using the extension 42 as a guide, and is also moved up and down with respect to the rotary table 2 connected to the shaft body 21. Further, the cylindrical body 24 and the shaft body 21 are connected to each other via the elevating mechanism 35, the support 36, and the extension 42. Therefore, when the cylindrical body 24 is rotated by the rotation mechanism 34, the respective members such as the support plate 25, the pins 26, and the elevating mechanism 35 connected to the cylindrical body 24 and the shaft body 21 are also rotated about the central axis P.

Figure 2:
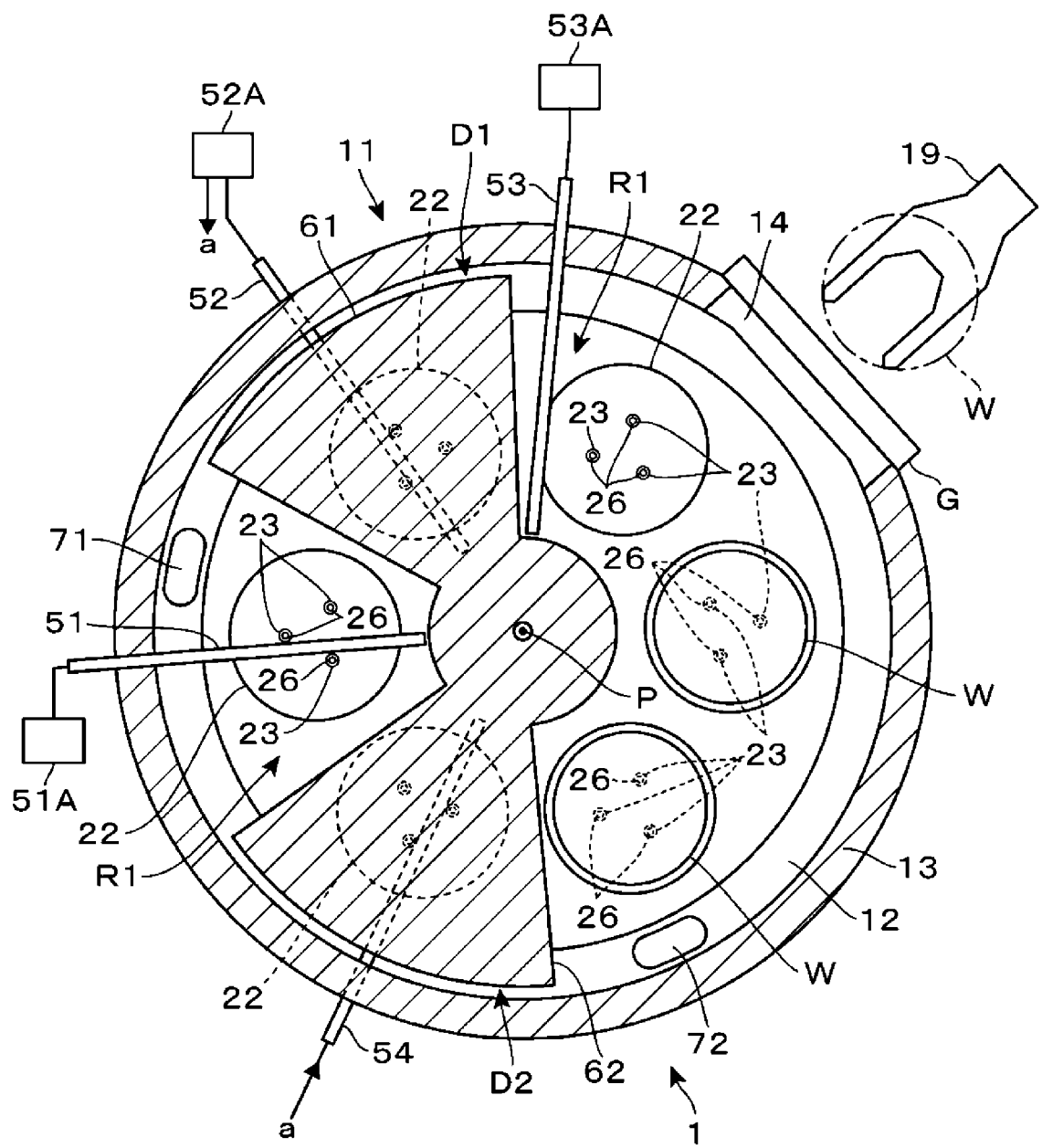
FIG. 2 is a horizontal cross-sectional plan view of the film forming apparatus.

As shown in FIG. 1, the film forming apparatus 1 includes a controller 10 composed of a computer for controlling the operation of each part of the apparatus. The controller 10 is provided with a program. Control signals are transmitted to each part of the apparatus so that each operation such as the elevation and rotation of the rotary table 2 by the drive mechanism 3, the supply and stop of the gases from the gas sources 51A, 52A, and 53A to each part of the apparatus, and the heating of the wafer W by the heater 75 is controlled by the program. This program is installed in the computer while being stored in a storage medium such as a hard disk, a compact disk, a memory card, or a DVD.

An operation of the film forming apparatus 1 will be described with reference to vertical cross-sectional side views of the apparatus in FIGS. 7 to 10. In this example, it is assumed that a bis(tertiary-butylamino)silane (BTBAS) gas is used as the first processing gas, $O_3$ gas is used as the second processing gas, and a $SiO_2$ film is formed on the wafer W. Further, it is assumed that the heater 75 is operated to heat the rotary table 2 so that the wafer W mounted on the rotary table 2 can be quickly heated to start a process.

In a state in which the rotary table 2 is located at the lower position and the pins 26 protrude upward from the recess 22 as described with reference to FIG. 5, the gate valve G is opened and the substrate transfer mechanism 19 supporting the wafer W is moved into the vacuum container 11. Then, the substrate transfer mechanism 19 is moved down to position the supported wafer W above a recess 22 among the six recesses 22 facing the transfer port 14, and delivers the wafer W onto the pins 26 protruding from the recess 22 (see FIG. 7). The substrate transfer mechanism 19 retracts and exits from the vacuum container 11. Then, the rotary table 2 is rotated by 60 degrees so that a recess 22 next to the recess 22 in which the wafer W is placed on the pins 26 faces the transfer port 14.

Then, the substrate transfer mechanism 19 is again moved into the vacuum container 11 while supporting the wafer W. The substrate transfer mechanism 19 is moved down to position the supported wafer W above a recess 22 among the six recesses 22 facing the transfer port 14, and delivers the wafer W onto the pins 26 protruding from the recess 22. The substrate transfer mechanism 19 retracts and exits from the vacuum container 11. Then, the rotary table 2 is rotated by 60 degrees so that a recess 22 next to the recess 22 in which the wafer W is placed on the pins 26 faces the transfer port 14. Thereafter, the rotation of the rotary table 2 by 60 degrees and the transfer of the wafer W to the pins 26 of the recess 22 facing the transfer port 14 by the substrate transfer mechanism 19 are repeated in the same manner so that the wafer W is sequentially transferred onto the pins 26 of each recess 22. While the wafer W is sequentially transferred onto the pins 26 of each recess 22 as described above, a height position of the rotary table 2 is maintained at the lower position. Thus, the wafer W supported on the pins 26 is not accommodated in each recess 22. That is, the wafer W is spaced apart from the rotary table 2.

Figure 9:
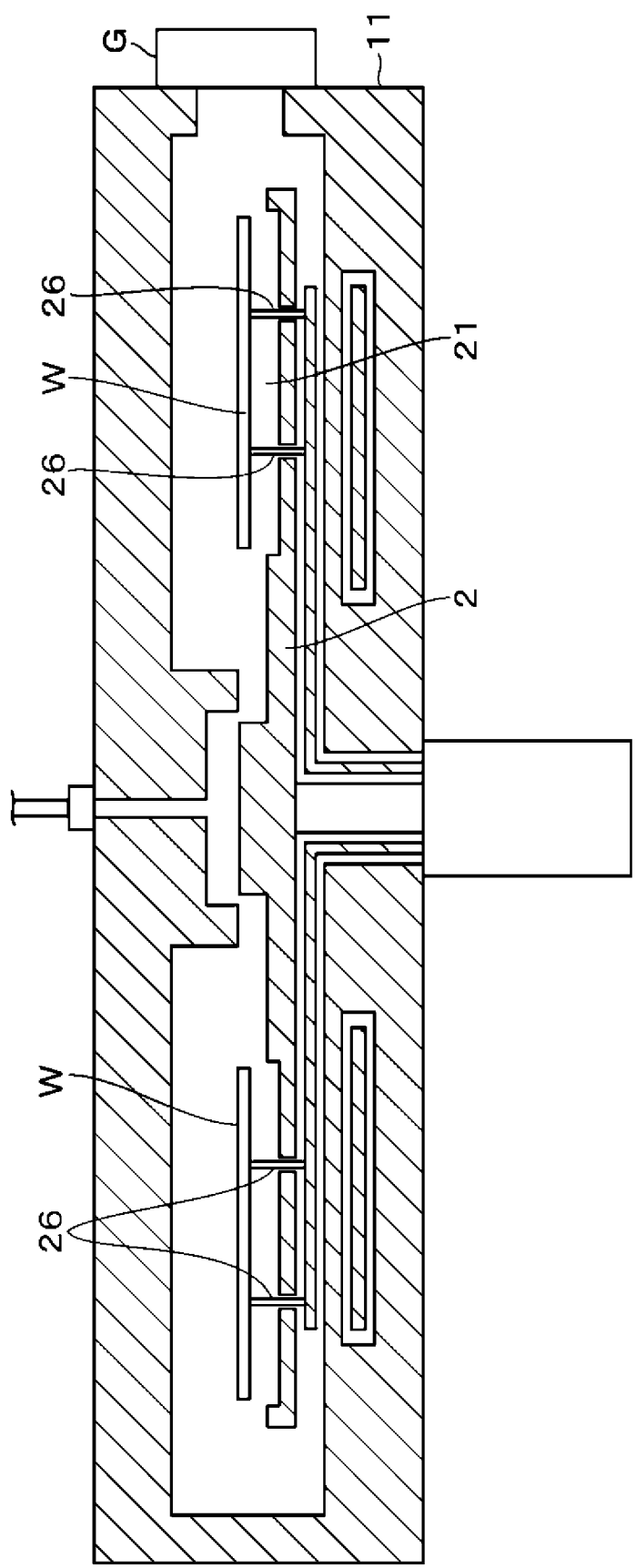
FIG. 9 is a plan view for showing an operation of the film forming apparatus.

Then, when the wafer W is transferred onto the pins 26 of the sixth recess 22, that is, when the wafers W are supported on the pins 26 of all the recesses 22 (see FIG. 8), the substrate transfer mechanism 19 retracts from the transfer port 14 and the gate valve G is closed (see FIG. 9). Thereafter, in a state in which the rotary table 2 is still located at the lower position, that is, in a state in which the pins 26 are relatively stationary with respect to the rotary table 2, the six wafers W are heated to a uniform desired temperature by radiating heat from the rotary table 2 heated by the heater 75.

Figure 10:
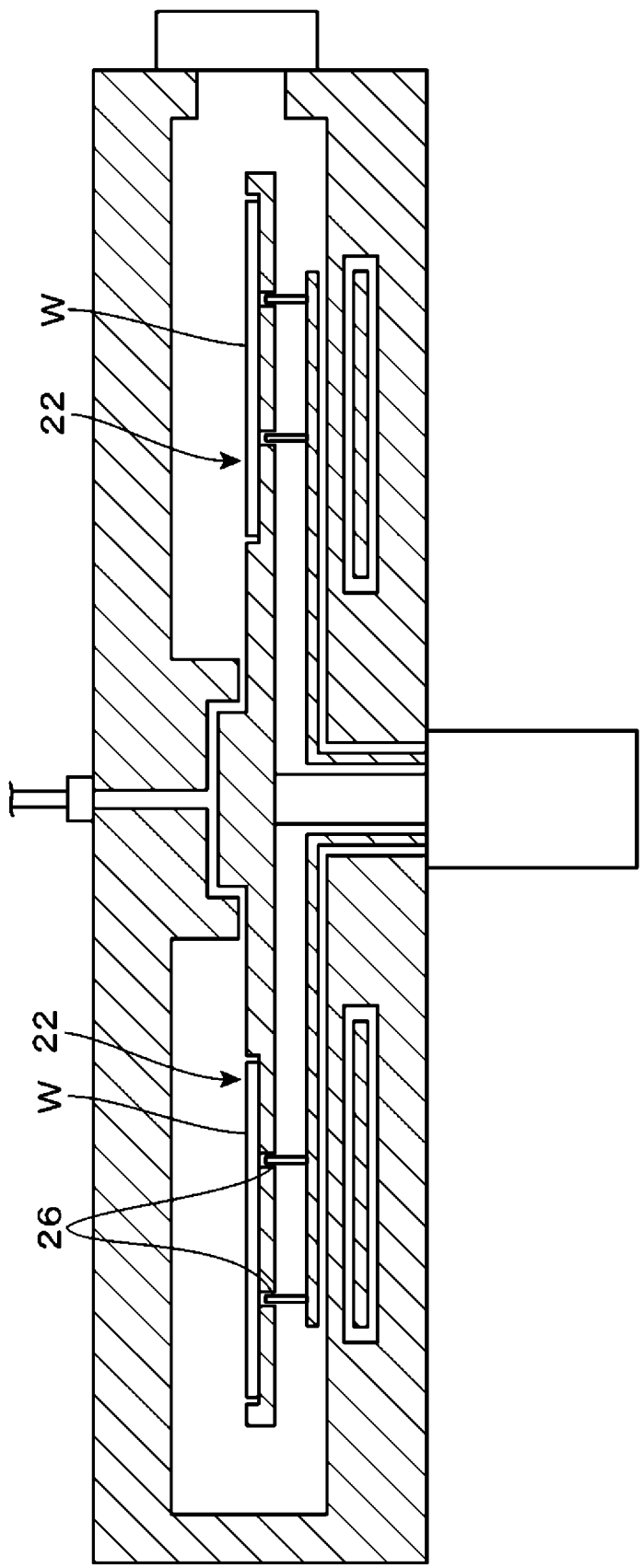
FIG. 10 is a plan view for showing an operation of the film forming apparatus.

For example, when a preset time elapses from a time when the sixth wafer W is placed on the pins 26 so that each wafer W is sufficiently heated, the rotary table 2 is moved to the upper position described with reference to FIG. 6 and the respective wafers W are simultaneously accommodated in the recesses 22, whereby the wafers W are switched from a state of being supported by the pins 26 to a state of being supported by the bottom surfaces of the recesses 22 (see FIG. 10). The preset time mentioned above is a time sufficient to prevent excessive warping or waviness when the wafers W are accommodated in the rotary table 2 as described later, and is, for example, ten seconds or more. The wafers W placed in the recesses 22 are heated by heat transfer from the rotary table 2 to a desired temperature higher than that when supported on the pins 26, for example, 300 degrees C. to 800 degrees C.

Thereafter, the inside of the vacuum container 11 is adjusted to a desired vacuum pressure by exhaust from the exhaust ports 71 and 72, and $N_2$ gas is supplied from the separation gas nozzles 52 and 54 and the central flow path 69. The $N_2$ gas supplied from the separation gas nozzles 52 and 54 serves as a separation gas and spreads in the separation regions D1 and D2 in the circumferential direction. Then, the $N_2$ gas flows to the outer periphery of the rotary table 2 and is exhausted from the exhaust ports 71 and 72. On the other hand, the $N_2$ gas supplied from the central flow path 69 onto the central portion of the rotary table 2 serves as a purge gas and spreads along the rotary table 2 in the radial direction. The $N_2$ gas is exhausted from the exhaust ports 71 and 72. Further, when the purge gas is supplied above the rotary table 2 as described above, the purge gas is also supplied to below the rotary table 2 so as to spread along the radial direction of the rotary table 2 and is exhausted from the exhaust ports 71 and 72.

The BTBAS gas and the $O_3$ gas are supplied from the first processing gas nozzle 51 and the second processing gas nozzle 53 to the first processing region R1 and the second processing region R2, respectively, and the rotary table 2 is rotated. The BTBAS gas is prevented from flowing into the second processing region R2 by the separation gas and the purge gas supplied on the central portion of the rotary table 2 and is exhausted from the exhaust port 71. The $O_3$ gas is prevented from flowing into the first processing region R1 by the separation gas and the purge gas supplied on the central portion of the rotary table 2 and is exhausted from the exhaust port 72. Each wafer W repeatedly passes through the first processing region R1, the separation region D1, the second processing region R2, and the separation region D2 in the named order by the rotation of the rotary table 2, whereby $SiO_2$ is deposited on a surface of the wafer W to form a $SiO_2$ film. When a film thickness of the $SiO_2$ film on each wafer W reaches a desired value, the supply of each gas into the vacuum container 11 is stopped, and each wafer W is unloaded from the vacuum container 11 by the substrate transfer mechanism 19 through an operation opposite to that at the time of loading the wafer W into the vacuum container 11.

As described above, in the film forming apparatus 1, the six wafers W are supported on the pins 26, heated above the rotary table 2, and then collectively transferred into the recesses 22. Thereafter, the processing gases are supplied to perform a film forming process. In order to explain the reason for adopting such an apparatus configuration, it is considered that the wafers W are sequentially placed in the recesses 22 by lift pins provided in the film forming apparatus of Patent Document 1 described above and then a film forming process is started. More specifically, tips of the lift pins are moved up and down so as to penetrate the through-holes 23 of each recess 22 facing the transfer port 14. That is, the lift pins are moved up and down with respect to only one of the plurality of recesses 22, and the wafers W sequentially transferred to the rotary table 2 by the substrate transfer mechanism 19 are placed in the recesses 22 one by one.

In addition, it is assumed that after the lift pins receive the wafer W from the substrate transfer mechanism 19, the lift pins are quickly moved down to place the wafer W in the recess 22. In that case, since the rotary table 2 is heated, heat is rapidly transferred from the rotary table 2 to each portion of the wafer W. As a result, a temperature difference occurs between front and back surfaces and in-plane portions of the wafer W. Therefore, there is a concern that relatively large warping or waviness may occur. Heat transfer progresses in each portion of the wafer W to make the temperature uniform, and the wafer W returns to a flat shape. However, when the wafer W is deformed, there is a concern that the back surface of the wafer W is moved by sliding substantially with respect to the bottom surface of the recess 22, thereby generating particles or scratches. In addition, there is a concern that such a deformation of the wafer W may cause damage to each film formed on the surface of the wafer W.

In order to prevent problems caused by the rapid heating of the wafer W, it is conceivable to allow the wafer W to be stationary for a predetermined time after supporting the wafer W on the lift pins. That is, it is considered that after the wafer W is supported by the lift pins and heated above the recess 22 by radiating heat from the rotary table 2, the wafer W is placed on the recess 22 and further heated to a desired temperature by the heat transfer from the recess 22. However, since the rotary table 2 cannot be rotated and the lift pins cannot be moved up and down while the wafer W is kept stationary above the recess 22, it is impossible to transfer a wafer W to another recess 22. Therefore, it takes a relatively long time to transfer the wafers W to all of the six recesses 22. Further, when the film forming process is started promptly after the wafers W are accommodated in the six recesses 22, the process may be started while a temperature difference occurs between the wafer W finally placed in the recess 22 and other wafers W. Thus, the process may vary among the wafers W. In order to prevent this problem, it is conceivable to start the film forming process after a preset time for making the temperatures of the respective wafers W uniform has elapsed after the placement of the wafers W in the six recesses 22 is completed. When the wafers W are transferred to the recesses 22 one by one by using the lift pins as described above, it is necessary to secure a time for supporting and heating each wafer W on the lift pins before placing the wafers W in the recesses 22 and a time for placing the final wafer W in the recess 22 and then making the temperatures of the respective wafers W uniform. Therefore, there is a possibility that the throughput of the film forming apparatus cannot be sufficiently enhanced.

However, according to the film forming apparatus 1, the wafers W are heated in a state of being supported by the pins 26 as described above and then are collectively placed on the rotary table 2. Thus, the time required for the lift pins to support the wafer W above the recess 22 to suppress deformation of the wafers W is not necessary. Therefore, after the wafers W are placed in the recesses 22, the process can be started after the temperatures of the respective wafers W rise to a desired temperature. Accordingly, the time required from the start of loading the first wafer W into the vacuum container 11 to the start of the film forming process on the wafer W can be made relatively short, so that a high throughput can be obtained for the film forming apparatus 1. Further, after the respective wafers W are heated while being kept stationary on the pins 26, the pins 26 are lowered to place the wafers W on the recesses 22. Therefore, according to the film forming apparatus 1, relatively large deformation of the wafers W when placed in the recesses 22 can be suppressed to suppress damage to the films, generation of particles, and formation of scratches on the back surface of the wafer W, which may otherwise be caused by deformation of the wafers W.

On the other hand, the recess 22 needs to be formed so as to have a depth at which the wafer W does not come off due to the rotation of the rotary table 2 and an air flow on the rotary table during the film forming process. However, as described above, in the film forming apparatus 1, the deformation of the wafer W during accommodation in the recess 22 is suppressed. Therefore, even when the depth of the recess 22 is relatively small, the wafer W fits in the recess 22 shortly after the wafer W is accommodated in the recess 22, and the rotary table 2 can be rotated to perform a process. That is, the depth of the recess 22 may be set to be relatively small. Due to such a small depth, it is possible to prevent the recess 22 from moving to the second processing region R2 while the first processing gas supplied into the recess 22 in the first processing region R1 remains without being completely removed in the separation region D1. Similarly, it is possible to prevent the recess 22 from moving to the first processing region R1 while the second processing gas supplied into the recess 22 in the second processing region R2 remains without being completely removed in the separation region D2. Accordingly, it is possible to prevent unnecessary mixing of the first processing gas and the second processing gas, prevent generation of particles, and enhance in-plane uniformity of the film thickness of the wafer W.

On the bottom surface of the recess 22, for example, a groove may be formed at a peripheral edge thereof in order to alleviate sliding due to deformation of the wafer W when the wafer W is placed in the recess 22. However, as described above, the film forming apparatus 1 suppresses such a deformation of the wafer W. Therefore, the bottom surface of the recess 22 may be a flat surface as in the above-described example, and the groove may not be provided.

Figure 11:
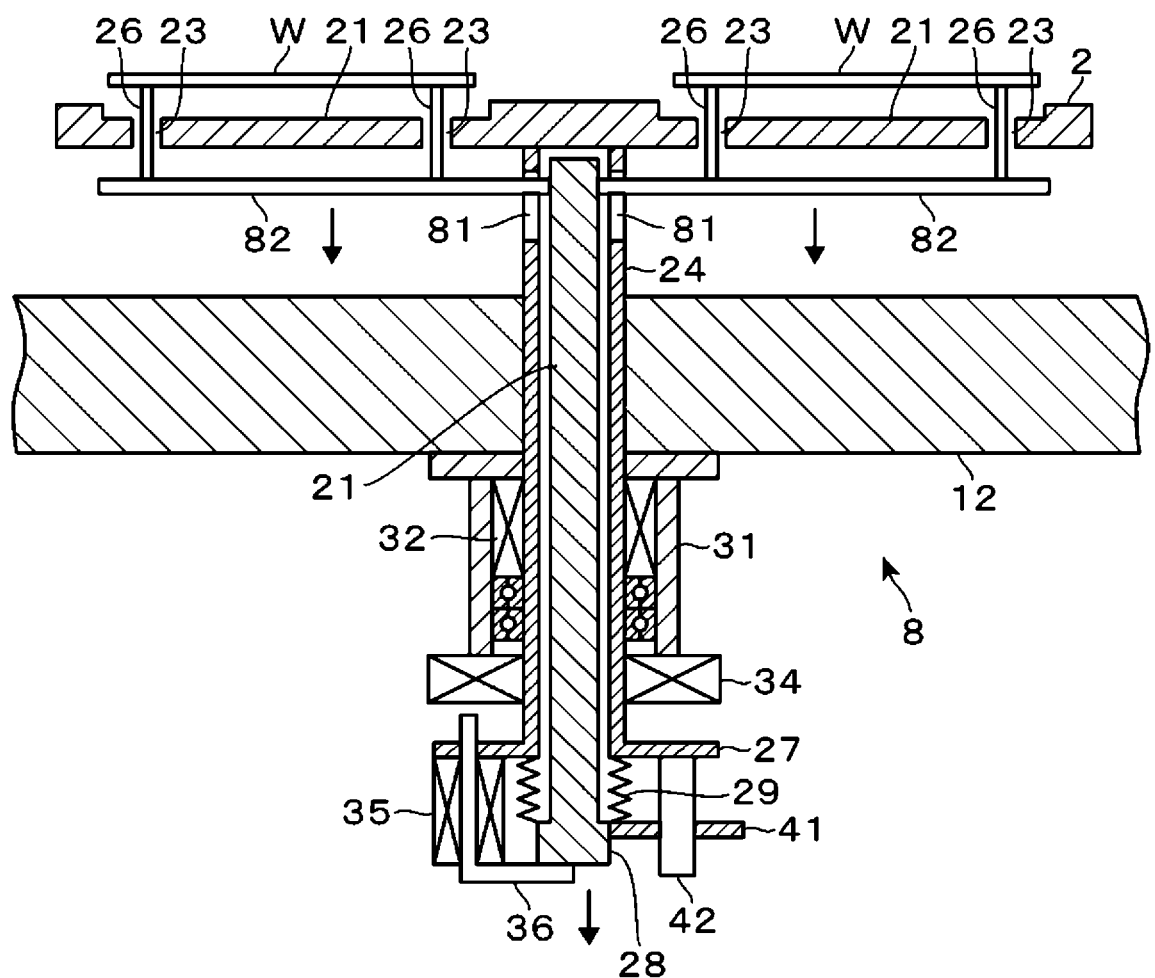
FIG. 11 is a vertical cross-sectional side view showing a modification of the film forming apparatus.

FIG. 11 shows a configuration of a film forming apparatus 8 which is a modification of the film forming apparatus 1. Hereinafter, the film forming apparatus 8 will be described by focusing on differences from the film forming apparatus 1. In the film forming apparatus 8, the upper end of the cylindrical body 24 is connected to the rotary table 2. On a side surface of the cylindrical body 24, six through-holes (only two of which are shown in the FIG. 81 are formed at intervals in the circumferential direction. The upper end of the shaft body 21 is not fixed to the lower surface of the rotary table 2. Base ends of six arms 82 (only two of which are shown in the figure) are connected to the shaft body 21 at intervals in the circumferential direction. Tips of the arms 82 extend toward the outside of the cylindrical body 24 via the through-holes 81. The pins 26 are provided at the tip of each arm 82. Therefore, the arms 82 correspond to the support plate 25 of the film forming apparatus 1.

In this film forming apparatus 8, by raising and lowering the shaft body 21 with the elevating mechanism 35, the arm 82 is moved up and down via the through-hole 81 and is moved between the upper position (the position shown in FIG. 11) where the pins 26 support the wafer W outside the recess 22 and the lower position where the pins 26 are moved away from the wafer W so that the wafer W is accommodated in the recess 22. Further, since the cylindrical body 24 and the shaft body 21 are connected to each other as in the film forming apparatus 1, the cylindrical body 24 and the shaft body 21 are rotated together by the rotation mechanism 34. When adopting the configuration in which the pins 26 are rotated together with the rotary table 2 as described above, one of the rotary table 2 and the pins 26 may be configured to move up and down with respect to the other. In addition, one of the shaft body 21 and the cylindrical body 24, which extend downward from the vacuum container 11, may be connected to the rotary table 2.

On the other hand, the number of the recesses 22 in the rotary table 2 may be plural and is not limited to the above-mentioned six. Further, a plurality of wafer transfer ports 14 as many as the number of the recesses 22 may be provided in the circumferential direction of the vacuum container 11. An apparatus configuration may be adopted in which the wafer W is transferred from each transfer port 14 to the upper region above the recess 22 by the transfer mechanism 19 and the wafer W is delivered onto the pins 26 of each recess 22. In that case, the pins 26 only need to be moved up and down with respect to the rotary table 2. That is, the pins 26 may not be rotated together with the rotary table 2. In the above-described example, three pins 26 are provided for each recess 22. However, it is only necessary for the pins 26 to support the wafer W in the upper region above the recess 22. The number of pins 26 for one recess 22 is not limited to three. Further, in the above-described example, the wafer W is supported on the pins 26 by moving the transfer mechanism 19 up and down while the pins 26 are kept stationary above the recess 22. However, when the wafer W is not accommodated in the recess 22, the wafer W may be supported on the pins 26 by moving the pins 26 up and down without changing a height of the transfer mechanism 19.

Further, there has been described the configuration in which the first processing gas and the second processing gas are discharged by the first processing gas nozzle 51 and the second processing gas nozzle 53, respectively, which are a gas supply. However, the present disclosure is limited to such a configuration. For example, shower heads having a lower surface configured to face the rotary table 2 may be provided as gas supplies in the first processing region R1 and the second processing region R2, respectively, and gases may be discharged from the respective shower heads to perform a process. Further, various gases for forming a film by ALD may be used as the first processing gas and the second processing gas. The present disclosure is not limited to the above-described examples of gases. Therefore, the film formed on the wafer W is not limited to the $SiO_2$ film. For example, a silicon-containing gas may be used as the first processing gas and a nitrogen-containing gas such as ammonia or the like may be used as the second processing gas to form a silicon nitride film on the wafer W.

Further, although there has been described the examples in which the substrate processing apparatus is configured as a film forming apparatus, the present disclosure is not limited to such a film forming apparatus. The present technique may be applied to an apparatus for converting a processing gas into plasma to modify a film formed on a wafer W or performing etching by the plasma. It should be noted that the embodiments disclosed herein are exemplary and are not limitative in all respects. The above-described embodiments may be omitted, replaced, modified, or combined in various forms without departing from the scope of the appended claims and their gist.

According to the present disclosure in some embodiments, it is possible to prevent occurrence of a processing abnormality when substrates are accommodated and heat-treated in a plurality of recesses of a rotary table.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus comprising:
a rotary table provided in a processing container;
a rotation mechanism configured to rotate the rotary table;
a plurality of recesses provided on an upper surface of the rotary table along a rotation direction of the rotary table and configured to accommodate a plurality of substrates, respectively;
a processing gas supply provided above the rotary table and configured to supply a processing gas onto the rotary table to process each of the substrates;
a heater configured to heat the rotary table;
a support configured to support the substrates in upper regions above the recesses so that the heater heats the substrates before being accommodated in the recesses;
an elevating mechanism configured to raise and lower the support relative to the rotary table so that the substrates are collectively moved from the upper regions into the recesses;
a shaft body extending in a vertical direction; and
a cylindrical body configured to surround a side circumference of the shaft body,
wherein one of the shaft body and the cylindrical body is connected to a lower surface of the rotary table while the other of the shaft body and the cylindrical body is connected to the support,
wherein the rotation mechanism is further configured to rotate the support together with the rotary table,
wherein the rotation mechanism is further configured to rotate both the shaft body and the cylindrical body, and
wherein the elevating mechanism is further configured to raise and lower the shaft body with respect to the cylindrical body.

2. The apparatus of claim 1, wherein the shaft body is connected to the lower surface of the rotary table,
wherein the cylindrical body is connected to the support, and
wherein the elevating mechanism is further configured to support the shaft body and raise and lower the rotary table.

* * * * *